United States Patent
ElHatem

(10) Patent No.: US 6,825,513 B2
(45) Date of Patent: Nov. 30, 2004

(54) HIGH POWER MOSFET SEMICONDUCTOR DEVICE

(75) Inventor: Abdul M. ElHatem, Redondo Beach, CA (US)

(73) Assignee: Xerox Corporation, Stamford, CT (US)

( * ) Notice: Subject to any disclaimer, the term of this patent is extended or adjusted under 35 U.S.C. 154(b) by 99 days.

(21) Appl. No.: 10/260,611

(22) Filed: Sep. 27, 2002

(65) Prior Publication Data

US 2004/0061182 A1 Apr. 1, 2004

(51) Int. Cl.[7] .............................................. H01L 29/78
(52) U.S. Cl. ............................................ 257/263; 257/262
(58) Field of Search .................................. 257/262–263

(56) References Cited

U.S. PATENT DOCUMENTS

| | | | |
|---|---|---|---|
| 4,754,310 A | 6/1988 | Coe ............................ | 357/13 |
| 5,216,275 A | 6/1993 | Chen ........................... | 257/493 |
| 5,438,215 A | 8/1995 | Tihanyi ....................... | 257/401 |
| 6,475,864 B1 * | 11/2002 | Sato et al. .................. | 438/268 |
| 6,551,909 B1 * | 4/2003 | Fujihira ....................... | 438/510 |
| 2001/0032998 A1 * | 10/2001 | Iwamoto et al. ............. | 257/330 |

FOREIGN PATENT DOCUMENTS

JP    2002-170955 A *    6/2002     ........... H01L/29/78

* cited by examiner

Primary Examiner—Allan R. Wilson
(74) Attorney, Agent, or Firm—Oliff & Berridge, PLC; Eugene O. Palazzo

(57) ABSTRACT

A high power MOSFET semiconductor having a high breakdown voltage. The new power device concept that reaches an area of a lower specific on-resistance, higher breakdown voltage and reduced device silicon area. This device architecture is built on the concepts of charge compensation in the drift region of the device. Where, the doping of the vertical drift region is increased by one order of magnitude. To counterbalance the added charges, fine-structured wells of opposite doping type to the drift region are introduced as part of the device structure. The charge compensation wells do not contribute to the on-state current conduction, therefore, this novel new generation of high voltage device architecture breaks the limit line of silicon. This architecture may extend to higher material resistivity and larger geometry to increase the voltage to 1kv plus.

6 Claims, 1 Drawing Sheet

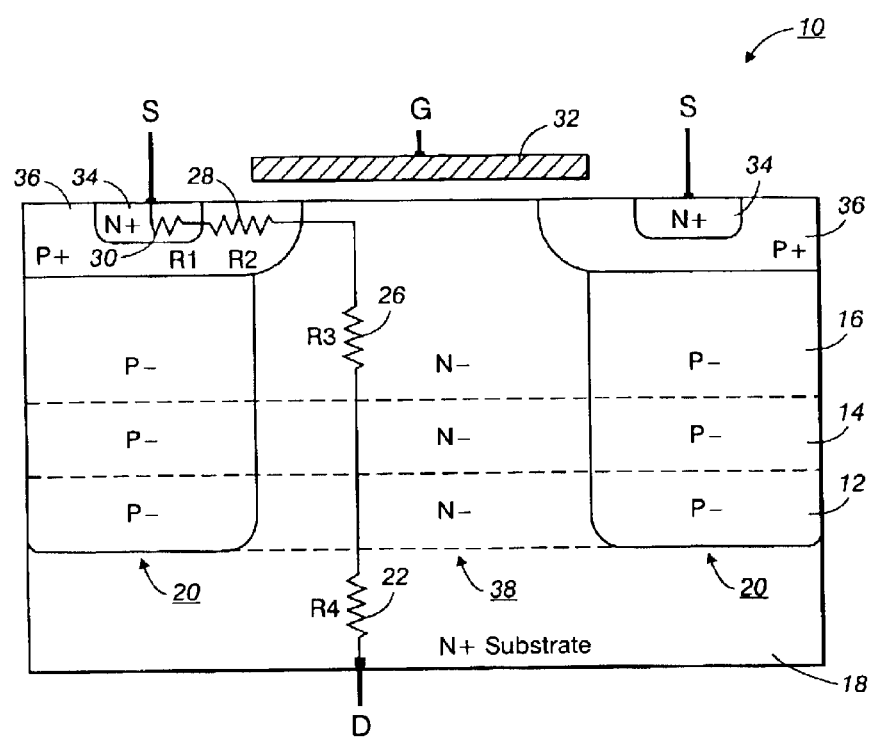

HIGH POWER MOSFET SEMICONDUCTOR DEVICE

BACKGROUND

High voltage DMOS(Diffused Metal Oxide Semiconductor) devices fall in two types. The planar type (no field or drift region) up to 50 volts and Field/Drift using in most cases RESURF physics up to 100 volts. The challenge has been how to improve device performance i.e. reducing on-resistance and maintaining good robust breakdown voltage. This invention introduces a novel new generation of high voltage device architecture that breaks the limit line of silicon. This architecture may extend to higher material resistivity and larger geometry to increase the voltage to 1 kv plus.

SUMMARY

A high power MOSFET semiconductor having a high breakdown voltage. The MOSFET semiconductor device is defined having a fine-structured wells of opposite doping type to the drift region in a way that the doping integral along the line perpendicular to the current flow remains smaller than the material specific breakthrough charge, which is for silicon $2.10^{12}/cm^2$. The electric field inside the device structure is fixed by the net charge of the two opposite doped wells. Therefore, a nearly horizontal field distribution can be achieved if both regions counterbalance each other perfectly. For higher blocking voltage only the depth of the wells has to be increased without altering the doping. This leads to a relationship between the blocking voltage and on-resistance that is linear in nature. This technique can produce a device having 1000 volts blocking voltage and RDSon reduction in the range of one order of magnitude compared to conventional technologies.

DESCRIPTION OF THE DRAWING

FIG. 1 shows a structure for the high power MOSFET semiconductor device.

DETAILED DESCRIPTION

The high power MOSFET semiconductor device in accordance with the present invention utilizes new device architecture. The architecture produces higher voltage, which can be realized in silicon. The architecture reaches an area of specific on-resistance that is much lower and breakdown voltage that is much higher, while maintaining shrink factor of five compared to the present state of the art devices. Referring to the FIGURE, the MOSFET semiconductor device 10 consists of structured p- and n-doped wells 20 and 38, respectively formed vertically coherent and optimized for individual device performance. The doped wells 20, respectively have opposing doping to a drift region 38 such that there is no contribution to current conduction in the turn-on state and having charge compensation in and lower on-resistance 22, 26, 28 and 30, respectively due to the drift region 38 having a higher n-doped epitaxial layer.

The method or process for forming the high power MOSFET semiconductor device 10 in accordance with the invention will now be describe. Referring once again to the FIGURE, an n+ substrate 18 is provided for depositing an undoped epitaxial layer 12 and masking and implanting n type and p type material to form a plurality of doped wells 20 and 38 on the n+ substrate 18. Next, there is deposited a second undoped epitaxial layer 14 and masking n type material and implanting both n type and p type material to continue forming the plurality of doped wells 28 and 30. Lastly, by depositing a n type doped epitaxial layer 16 and masking and implanting a p type material completes the formation of the plurality of doped wells 20 and 38. By using well known semiconductor processing techniques, the masking and implanting of p+ and n+ source/drains as well as forming gate oxide and contacts 34, 36 and 32 complete formation of the MOSFET semiconductor device. Additionally, although not shown it should be understood that the opposite device may be built using the process described above by exchanging the n type with p type material and the p type with n type material.

By introducing the structured fine wells 20 with opposing doping to the drift region 38 there is no contribution to the current conduction in the turn-on state yielding lower on-resistance due to higher doping in the epitaxial layer drift region 38. Additionally, this creates higher blocking breakdown voltage by having the wells doping integral perpendicular to current flow remaining smaller than material specific breakdown charge for silicon ($2.10^{12}/cm^2$). The higher blocking voltage is controlled to a higher extent via the depth of the doped wells 20 and 38 not altering the doping levels. Also, the lower on-resistance is controlled and kept low via the higher drift regions 38 doping level.

In summary, this architecture concept is based on charge compensation in the increased doping (one order of magnitude higher) drift region while counter balancing the additional charge by implementing a fine structured doping wells of the opposite type. The blocking voltage remains unaltered. The charge compensation wells do not contribute to the current conduction during turn-on state, while, the increased doping drift region lowers the on-resistance proportionally to the doping level. The breakdown voltage relationship with on-resistance is proportional to lower doping and thicker Epi layer. Where, lower doped/thicker layer Epi leads to higher breakdown and higher on-resistance. This limitation can be overcome by introducing opposite doped type wells into the drift region, where, the doping integral along a perpendicular line to the current flow is optimized to remain smaller than the material specific breakdown charge, which is for silicon about $2.10^{12}/cm^2$.

It should further be noted that numerous changes in details of construction and the combination and arrangement of elements may be resorted to without departing from the true spirit and scope of the invention as hereinafter claimed.

What is claimed is:

1. A MOSFET semiconductor device comprising:

structured p-doped wells formed vertically that include doping opposite to a vertically formed n- doped drift region located between the p- doped wells, the vertically formed n- doped drift region includes a higher doped epitaxial layer than at least part of the p- doped wells such that there is no contribution from the oppositely doped p- doped wells to current conduction in the turn-on state and having charge compensation in and lower on-resistance due to the vertically formed n- doped drift region having the higher doped epitaxial layer.

2. The high power MOSFET semiconductor device according to claim 1 further comprising:

the doping integral along a line perpendicular to current flow remains smaller than a material specific breakdown charge for silicon.

3. The high power MOSFET semiconductor device according to claim 1 further comprising:

controlling a blocking voltage by altering a depth of the doped wells without altering doping levels.

4. A high power MOSFET semiconductor system comprising:

a substrate;

at least two doped wells on the substrate that include first and second undoped epitaxial layers with implanted p-type material; and a drift region located between the at least two doped wells, the drift region includes a higher doped epitaxial layer than at least part of the p- type material with implanted n-type material and includes doping opposite to the at least two doped wells, wherein an electric field inside the higher power MOSFET semiconductor system is fixed by a net charge of the at least two doped wells and the oppositely doped drift region.

5. The high power MOSFET semiconductor system according to claim 4, further comprising:

the doping integral along a line perpendicular to current flow remains smaller than a material specific breakdown charge for silicon.

6. The high power MOSFET semiconductor system according to claim 4, further comprising:

controlling a blocking voltage by altering a depth of the doped wells without altering doping levels.

* * * * *